(12) United States Patent
Fazan et al.

(10) Patent No.: US 7,342,842 B2
(45) Date of Patent: *Mar. 11, 2008

(54) DATA STORAGE DEVICE AND REFRESHING METHOD FOR USE WITH SUCH DEVICE

(75) Inventors: Pierre Fazan, Morges (CH); Serguei Okhonin, Lausanne (CH)

(73) Assignee: Innovative Silicon, S.A., Lausanne (CH)

( * ) Notice: Subject to any disclaimer, the term of this patent is extended or adjusted under 35 U.S.C. 154(b) by 22 days.

This patent is subject to a terminal disclaimer.

(21) Appl. No.: 11/649,945

(22) Filed: Jan. 5, 2007

(65) Prior Publication Data

US 2007/0109896 A1    May 17, 2007

Related U.S. Application Data

(62) Division of application No. 11/048,387, filed on Feb. 1, 2005, now Pat. No. 7,170,807, which is a division of application No. 10/487,162, filed as application No. PCT/EP03/02747 on Mar. 17, 2003, now Pat. No. 6,982,918.

(30) Foreign Application Priority Data

| Apr. 18, 2002 | (EP) | .................................. 02405314 |
| May 29, 2002 | (EP) | .................................. 02077116 |

(51) Int. Cl.
*G11C 7/00* (2006.01)
*G11C 11/24* (2006.01)
*G11C 11/34* (2006.01)

(52) U.S. Cl. ....................... 365/222; 365/191; 365/149; 365/150; 365/184

(58) Field of Classification Search ..................... None
See application file for complete search history.

(56) References Cited

U.S. PATENT DOCUMENTS

3,439,214 A    4/1969    Kabell
3,997,799 A    12/1976   Baker (Continued)

FOREIGN PATENT DOCUMENTS

EP    0 030 856    6/1981

(Continued)

OTHER PUBLICATIONS

"A Capacitorless Double-Gate DRAM Cell", Kuo et al., IEEE Electron Device Letters, vol. 23, No. 6, Jun. 2002, pp. 345-347.

(Continued)

*Primary Examiner*—Amir Zarabian
*Assistant Examiner*—Michael Weinberg
(74) *Attorney, Agent, or Firm*—Neil A. Steinberg

(57) ABSTRACT

A data storage device such as a DRAM memory having a plurality of data storage cells 10 is disclosed. Each data storage cell 10 has a physical parameter which varies with time and represents one of two binary logic states. A selection circuit 16, writing circuits 18 and a refreshing circuit 22 apply input signals to the data storage cells to reverse the variation of the physical parameter with time of at least those cells representing one of the binary logic states by causing a different variation in the physical parameter of cells in one of said states than in the other.

20 Claims, 5 Drawing Sheets

U.S. PATENT DOCUMENTS

| | | |
|---|---|---|
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,791,610 A | 12/1988 | Takemae |
| 4,979,014 A | 12/1990 | Hieda et al. |
| 5,144,390 A | 9/1992 | Matloubian |
| 5,164,805 A | 11/1992 | Lee |
| 5,258,635 A | 11/1993 | Nitayama et al. |
| 5,388,068 A | 2/1995 | Ghoshal et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidaka et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,566,177 B1 | 5/2003 | Radens et al. |
| 6,567,330 B2 | 5/2003 | Fujita et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,661,042 B2 | 12/2003 | Hsu |
| 6,714,436 B1 | 3/2004 | Burnett et al. |
| 6,721,222 B2 | 4/2004 | Somasekhar et al. |
| 6,771,546 B2 | 8/2004 | Ikehashi et al. |
| 6,861,689 B2 | 3/2005 | Burnett |
| 6,913,964 B2 | 7/2005 | Hsu |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112859 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2003/0168677 A1 | 9/2003 | Hsu |
| 2003/0213994 A1 | 11/2003 | Hayashi et al. |
| 2004/0041206 A1 | 3/2004 | Bhattacharyya |
| 2004/0041208 A1 | 3/2004 | Bhattacharyya |
| 2004/0042268 A1 | 3/2004 | Bhattacharyya |
| 2004/0108532 A1 | 6/2004 | Forbes |
| 2005/0141262 A1 | 6/2005 | Yamada et al. |

FOREIGN PATENT DOCUMENTS

| | | |
|---|---|---|
| EP | 0 350 057 B1 | 1/1990 |
| EP | 0 354 348 A2 | 2/1990 |
| EP | 0 202 515 B1 | 3/1991 |
| EP | 0 207 619 B1 | 8/1991 |
| EP | 0 175 378 B1 | 11/1991 |

| | | |
|---|---|---|
| EP | 0 253 631 B1 | 4/1992 |
| EP | 0 513 923 | 11/1992 |
| EP | 0 300 157 B1 | 5/1993 |
| EP | 0 564 204 A2 | 10/1993 |
| EP | 0 579 566 A2 | 1/1994 |
| EP | 0 362 961 | 2/1994 |
| EP | 0 599 506 A1 | 6/1994 |
| EP | 0 359 551 B1 | 12/1994 |
| EP | 0 366 882 B1 | 5/1995 |
| EP | 0 465 961 B1 | 8/1995 |
| EP | 0 694 977 | 1/1996 |
| EP | 0 333 426 B1 | 7/1996 |
| EP | 0 727 820 A1 | 8/1996 |
| EP | 0 739 097 A2 | 10/1996 |
| EP | 0 245 515 B1 | 4/1997 |
| EP | 0 788 165 A2 | 8/1997 |
| EP | 0 801 427 | 10/1997 |
| EP | 0 510 607 B1 | 2/1998 |
| EP | 0 537 677 B1 | 8/1998 |
| EP | 0 858 109 A2 | 8/1998 |
| EP | 0 860 878 A2 | 8/1998 |
| EP | 0 869 511 A2 | 10/1998 |
| EP | 0 878 804 | 11/1998 |
| EP | 0 920 059 A2 | 6/1999 |
| EP | 0 924 766 A2 | 6/1999 |
| EP | 0 642 173 B1 | 7/1999 |
| EP | 0 727 822 B1 | 8/1999 |
| EP | 0 933 820 A1 | 8/1999 |
| EP | 0 951 072 A1 | 10/1999 |
| EP | 0 971 360 A1 | 1/2000 |
| EP | 0 980 101 A2 | 2/2000 |
| EP | 0 601 590 B1 | 4/2000 |
| EP | 0 993 037 A2 | 4/2000 |
| EP | 0 836 194 B1 | 5/2000 |
| EP | 0 599 388 B1 | 8/2000 |
| EP | 0 689 252 B1 | 8/2000 |
| EP | 0 606 758 B1 | 9/2000 |
| EP | 0 682 370 B1 | 9/2000 |
| EP | 1 073 121 A2 | 1/2001 |
| EP | 0 726 601 B1 | 9/2001 |
| EP | 0 731 972 | 11/2001 |
| EP | 1 162 663 A2 | 12/2001 |
| EP | 1 162 744 | 12/2001 |
| EP | 1 179 850 | 2/2002 |
| EP | 1 180 799 | 2/2002 |
| EP | 1 191 596 A2 | 3/2002 |
| EP | 1 204 146 | 5/2002 |
| EP | 1 204 147 | 5/2002 |
| EP | 1 209 747 | 5/2002 |
| EP | 0 744 772 B1 | 8/2002 |
| EP | 1 233 454 A2 | 8/2002 |
| EP | 0 725 402 B1 | 9/2002 |
| EP | 1 237 193 | 9/2002 |
| EP | 1 241 708 | 9/2002 |
| EP | 1 253 634 | 10/2002 |
| EP | 0 844 671 B1 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | 62-272561 | 11/1987 |
| JP | 02-294076 | 2/1991 |
| JP | 3-171768 | 7/1991 |
| JP | 8-213624 | 8/1996 |
| JP | 8-274277 | 10/1996 |
| JP | 9-046688 | 2/1997 |
| JP | 9-82912 | 3/1997 |
| JP | 10-242470 | 9/1998 |
| JP | 11-87649 | 3/1999 |
| JP | 2000-247735 | 8/2000 |
| JP | 2000-274221 | 9/2000 |
| JP | 2000-389106 | 12/2000 |
| JP | 2001-180633 | 6/2001 |
| JP | 2002-009081 | 1/2002 |
| JP | 2002-94027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"A Capacitorless Double-Gate DRAM Cell for High Density Applications", Kuo et al., IEEE IEDM, 2002, pp. 843-946.
"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.
"The Multistable Charge-Controlled Memory Effect in SOI MOS Transistors at Low Temperatures", Tack et al., IEEE Transactions on Electron Devices, vol. 37, No. 5, May 1990, pp. 1373-1382.
"Mechanisums of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).
"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).
FBC (Floating Body Cell) for Embedded DRAM on SOI, Inoh et al., 2003 Symposium on VLSI Circuits Digest of Technical Papers, Jun. 2003 (2 pages).
"Toshiba's DRAM Cell Piggybacks on SOI Wafer", Y. Hara, EE Times, Jun. 2003.
"Memory Design Using a One-Transistor Gain Cell on SOI", Ohsawa et al., IEEE Journal of Solid-State Circuits, vol. 37, No. 11, Nov. 2002, pp. 1510-1522.
"Opposite Side Floating Gate SOI FLASH Memory Cell", Lin et al., IEEE, Mar. 2000, pp. 12-15.
"Advanced TFT SRAM Cell Technology Using a Phase-Shift Lithography", Yamanaka et al., IEEE Transactions on Electron Devices, vol. 42, No. 7, Jul. 1995, pp. 1305-1313.
"Soft-Error Characteristics in Bipolar Memory Cells with Small Critical Charge", Idel et al., IEEE Transactions on Electron Devices, vol. 38, No. 11, Nov. 1991, pp. 2465-2471.
"An SOI 4 Transistors Self-Refresh Ultra-Low-Voltage Memory Cell", Thomas et al., IEEE, Mar. 2003, pp. 401-404.
"Design of a SOI Memory Cell", Stanojevic et al., IEEE Proc. 21$^{st}$ International Conference on Microelectronics (MIEL '97), vol. 1, NIS, Yugoslavis, Sep. 14-17, 1997, pp. 297-300.
"Effects of Floating Body on Double Polysilicon Partially Depleted SOI Nonvolatile Memory Cell", Chan et al., IEEE Electron Device Letters, vol. 24, No. 2, Feb. 2003, pp. 75-77.
"MOSFET Design Simplifies DRAM", P. Fazan, EE Times, May 14, 2002 (3 pages).
"One of Application of SOI Memory Cell—Memory Array", Lončar et al., IEEE Proc. 22$^{nd}$ International Conference on Microelectronics (MIEL 2000), vol. 2, NIŠ, Serbia, May 14-17, 2000, pp. 455-458.
"A SOI Current Memory for Analog Signal Processing at High Temperature", Portmann et al., 1999 IEEE International SOI Conference, Oct. 1999, pp. 18-19.
"Chip Level Reliability on SOI Embedded Memory", Kim et al., Proceedings 1998 IEEE International SOI Conference, Oct. 1998, pp. 135-139.
"Analysis of Floating-Body-Induced Leakage Current in 0.15µ m SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A Wel, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAM", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Studying the Impact of Gene Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure In SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

Fully Isolated Lateral Bipolar-MOS Transistors Fabricated in Zone-Melting-Recrystallized Si Films on SiO$_2$ -. Tssur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"DRAM Design Using the Taper-Isolated Dynamic RAM Cell, Leiss et al.", IEEE Transactions on Electronic Devices, vol. ED-29, No. 4, Apr. 1982, pp. 707-714.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"Simulation of Floating Body Effect in SOI Circuits Using BSIM3SOI", Tu et al., Proceedings of Technical Papers (IEEE Cat No. 97[th]8303), pp. 339-342, 1997.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1998, pp. 1791-1794.

Hot-Carrier Effect in Ultra-Thin-Film (UTF) Fully-Depleted SOI MOSFET's, Yu et al., 54th Annual Device Research Conference Digest (Cat. No. 96[th]8193), pp. 22-23, 1996.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE Electron Device Letters, vol. 15, No. 12, Dec. 1994, pp. 510-512.

"Dynamic Threshold-Voltage MOSFET (DTMOS) for Ultra-Low Voltage Operation", Assaderaghi et al., 1994 EEE, IEDM 94, pp. 809-812.

"A Capacitorless DRAM Cell on SOI Substrate", Wann et al., IEEE IEDM 1993, pp. 635-638.

DATA STORAGE DEVICE AND REFRESHING METHOD FOR USE WITH SUCH DEVICE

This application is a divisional application of application Ser. No. 11/048,387, filed Feb. 1, 2005 (now U.S. Pat. No. 7,170,807, which is a divisional application of application Ser. No. 10/487,162, filed Feb. 17, 2004 (now U.S. Pat. No. 6,982,918), which is the National Stage of International Application No. PCT/EP03/02747, filed Mar. 17, 2003, which claims priority to European Patent Application Ser. No. 02077116, filed May 29, 2002, and European Patent Application Ser. No. 02405314, filed Apr. 18, 2002.

TECHNICAL FIELD OF THE INVENTION

The present invention relates to a data storage device, and relates particularly, but not exclusively, to a semiconductor memory device. The invention also relates to a method of refreshing a data storage device.

BACKGROUND OF THE INVENTION

DRAM (Dynamic Random Access Memory) devices are known in which an array of charge storage cells is provided, each storage cell consisting of a single transistor and a single capacitor. As is well known, each storage cell stores a single binary data bit according to whether the associated capacitor is charged (data state "1") or discharged (data state "0"). It is also well known that the charge stored in the charged capacitors decays with time, and that it is therefore necessary to rewrite the data to the charged storage cells by periodically recharging the capacitors. A conventional DRAM arrangement of this type is shown in FIG. 1. The DRAM device shown in FIG. 1 is provided with m columns and n rows. A data storage cell 10 consisting of a single transistor and a single capacitor is located at each intersection of a row and a column.

For each data storage cell, the source of the associated transistor is connected to one terminal of a capacitor, the other terminal of which is connected to a ground terminal or a given reference voltage (not shown), the gates of the transistors of each row are connected together by a respective conductive track 12, and the drains of the transistors of each column are connected together by a respective conductive track 14. Each of the conductive tracks 12 is connected to a selection circuit 16 for sequentially scanning the conductive tracks 12 of the memory device, and the conductive tracks 14 are each connected to respective writing circuits 18$i$ and reading circuits 20$i$, where i varies from 1 to m.

In order to refresh the charge states of the data storage cells 10 to counteract the effect of the charge stored in each capacitor decaying with time, the selection circuit 16 scans lines 1 to n by sequentially applying a signal to each conductive track 12 to successively switch on the transistors of all of the data storage cells 10 connected to the conductive track 12 being addressed. This in turn enables the reading circuits 20$i$ to determine the charge state of the associated capacitor by determining the current flowing through each transistor. In response to the determination of the charge state of each capacitor determined by the associated reading circuit 20$i$, the associated writing circuit 18$i$ causes the capacitor to be recharged or not, depending on its previous charge state.

Prior art DRAM devices of the type shown in FIG. 1 suffer from the drawback that modern memory devices have capacities typically of the order of 1 Gb, such devices typically comprising 1048576 lines. The refreshing process typically requires 10 to 50 ns for each line, as a result of which the refreshing process for a 1 Gb device typically requires 10 to 50 ms. Since the refreshing process must typically be carried out about 10 times per second, the time necessary for the refreshing process is of the same order of magnitude as that remaining for the data reading and writing operations. This results in the time required for refreshing limiting the capacity of the memory devices and requiring that special steps be taken to reduce leakage currents.

Preferred embodiments of the present invention seek to overcome the above disadvantages of the prior art.

SUMMARY OF THE INVENTION

According to an aspect of the present invention, there is provided a data storage device comprising:

a plurality of data storage cells, each said cell having a physical parameter in use which varies with time and has one of two data representing states, each said data representing state representing a respective binary logic state; and refreshing means for applying input signals to each said data storage cell to at least partially reverse variation of said physical parameter with time of at least those data storage cells in a predetermined one of said states, wherein said input signals cause a different variation in said physical parameter in cells in one of said data representing states than the variation caused in cells in the other of said data representing states.

Data refreshing means are provided to at least partially reverse the variation of said physical parameter with time by means of input signals causing a different variation in said physical parameter in cells in one of said data representing states than the variation caused in cells in the other of said data representing states. This provides the advantage that each data storage cell can be re-written without the need to read the state of each cell in order to enable the re-write operation to proceed. In addition, the write signal can be input to all data storage cells simultaneously, thus significantly increasing the speed of the refreshing operation compared with prior art devices.

In a preferred embodiment, said at least partial reversal of said physical parameter occurs to a greater extent for said cells in said predetermined one of said data representing states than in the other of said states, and said input signals are applied sufficiently frequently in use that said states remain distinguishable from each other.

The device may further comprise writing means for applying input signals to each said data storage cell to adjust said physical parameter of said cell to select the binary logic state represented by each said data storage cell.

The device may further comprise reading means for determining the data representing state of each said data storage cell.

Said input signals may at least partially reverse variation of said physical parameter for cells in each of said data representing states.

The data storage device may be a semiconductor device.

In a preferred embodiment, at least some of said data storage cells each comprise a respective field effect transistor having a first threshold voltage when in said first state and a second threshold voltage when in said second state.

In a preferred embodiment, at least one said field effect transistor comprises a respective source, a respective drain, a respective body arranged between the corresponding said source and said drain and adapted to retain an electrical charge generated in said body representing one or the other of two binary data states, and at least one respective gate adjacent the corresponding said body, wherein said refreshing means is adapted to apply voltage signals between at least one said gate and said drain of each said cell lying between said first and second threshold voltages.

Said refreshing means may be adapted to also apply signals to at least partially reverse the variation of said physical parameter in the other of said data representing states.

Said refreshing means is preferably adapted to apply signals partially reversing the variation of said charge in the other of said data representing states by means of recombination of charge carriers with charge carriers of opposite polarity.

The device may be a memory device.

According to another aspect of the present invention, there is provided a method of refreshing data in a data storage device comprising a plurality of data storage cells, each said cell having a physical parameter in use which varies with time and has one of two data representing states, each said data representing state representing a respective binary logic state, the method comprising applying input signals to each said data storage cell to at least partially reverse variation of said physical parameter with time of at least those data storage cells in a predetermined one of said states, wherein said input signals cause a different variation in said physical parameter in cells in one of said data representing states than the variation caused in cells in the other of said data representing states.

Said input signals may cause said at least partial reversal of said physical parameter occurs to a greater extent for said cells in said predetermined one of said data representing states than in the other of said states.

The method may further comprise the step of applying signals to at least partially reverse the variation of said physical parameter in the other of said data representing states.

The step of applying signals to at least partially reverse the variation of said physical parameter in the other of said data representing states preferably causes recombination of charge carriers with charge carriers of opposite polarity.

Said input signals may at least partially reverse variation of said physical parameter for cells in each of said data representing states.

BRIEF DESCRIPTION OF THE DRAWINGS

A preferred embodiment of the invention will now be described, by way of example only and not in any limitative sense, with reference to the accompanying drawings, in which.

DETAILED DESCRIPTION

Figure 1:
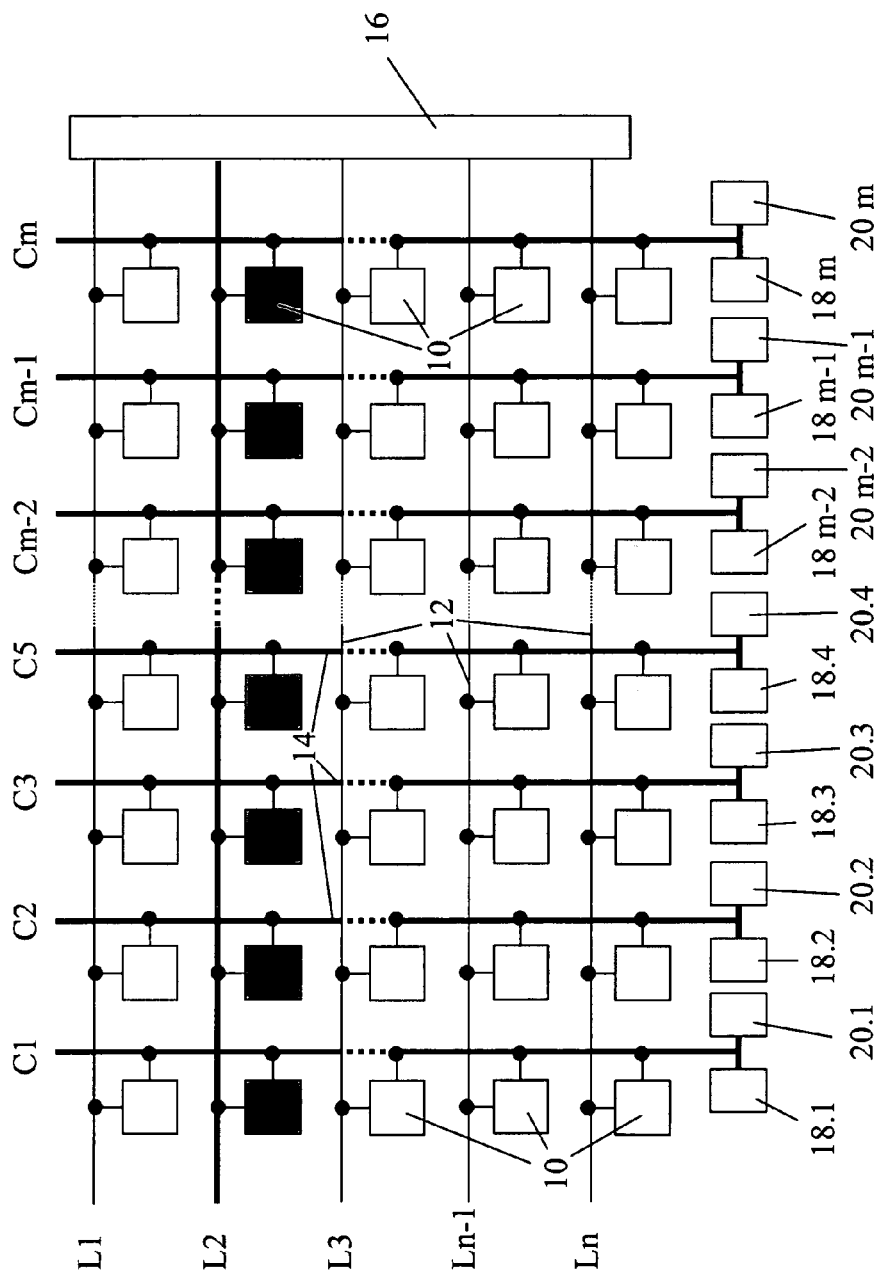
FIG. 1 is a schematic representation of a prior art DRAM memory device.
Figure 2:
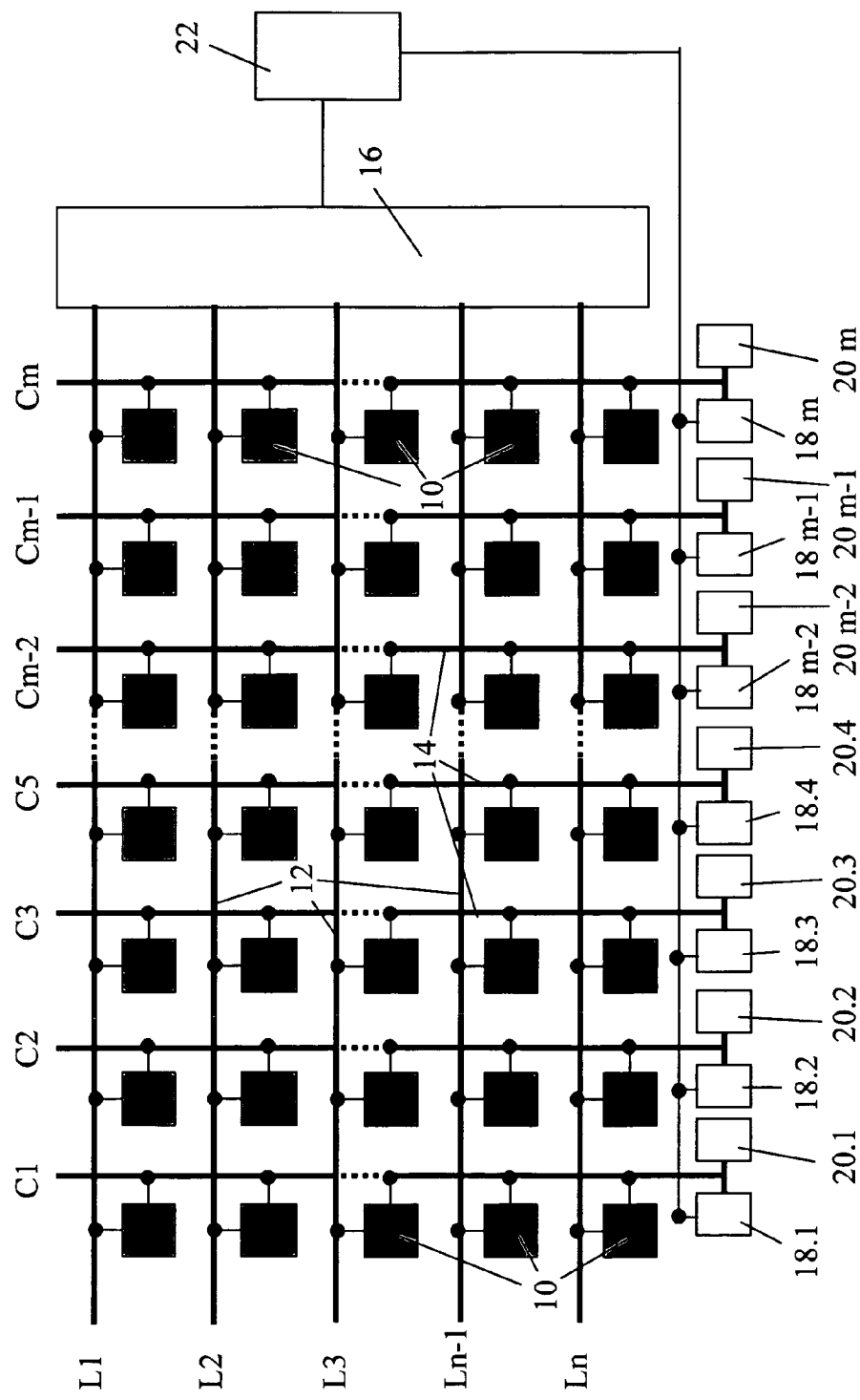
FIG. 2 is a schematic representation, corresponding to FIG. 1, of a DRAM device embodying the present invention.
Figure 5:
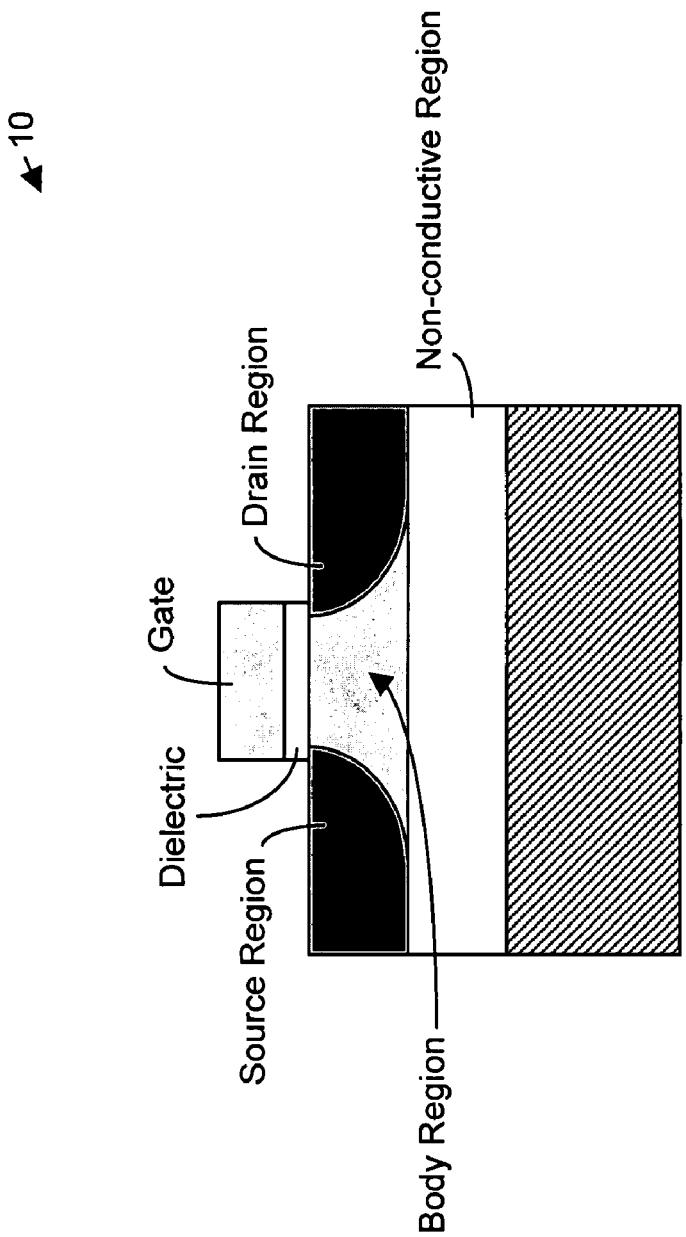
FIG. 5 is a representation of a prior art memory cell.

Referring to FIG. 2, in which parts common to the device of FIG. 1 are denoted by like reference numerals, a DRAM device has an array of m columns and n lines of memory cells 10, each of which comprises an NMOS SOI (silicon on insulator) field effect transistor, as described in greater detail in European patent application number 01810587.4 (which corresponds, at least in part, to U.S. Pat. No. 6,969,662). As described in greater detail in that document, it is possible to generate a charge in the body of such a transistor by the application of predetermined voltage pulses between the gate and drain and between the source and drain of the transistor. (See, for example. FIG. 5). In particular, a positive charge is generated and stored in the body of an NMOS transistor by means of the application of a voltage between the source and drain of the transistor when in its conductive state, the voltage difference between the source and drain generating electron-hole pairs by impact ionisation. The electrons are then removed to the source or drain, and the holes are stored in the body of the transistor. The positive charge can be removed by forward biasing the body-drain junction.

In the DRAM device of FIG. 2, the source of each transistor is connected to a ground terminal, the gates of the transistors of each line are connected to a conductive track 12, and the drains of the transistors of each column are connected to a conductive track 14. As in the device of FIG. 1, the conductive tracks 12 are all connected to a selection circuit 16, and a writing circuit 18$i$ and reading circuit 20$i$ is connected to each conducting track 14. A refreshing circuit 22 is also provided, the refreshing circuit 22 being connected to each of the conductive tracks 12 via the selection circuit, and to each of the conductive tracks 14 via the corresponding writing circuits 18$i$.

Figure 3:
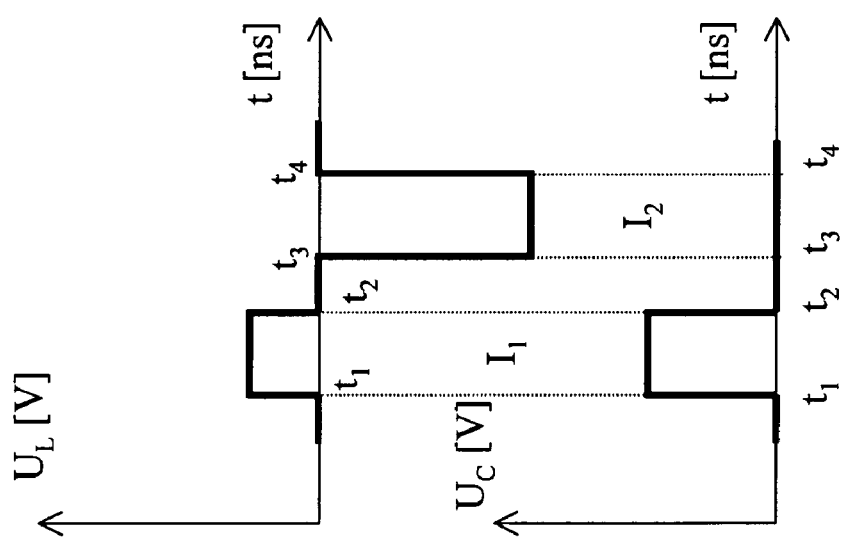
FIG. 3 shows a pulse pattern to be applied to the gates and drains of the transistors of the device of FIG. 2 during a refresh operation.

European patent application no. 01810587.4 describes how data can be written to the individual memory cells 10 of the DRAM device of FIG. 2, and how the charge state, representing the binary data state, of each memory cell 10 can be determined. The "zero" and "one" binary states of each stored bit are represented by the presence or absence of a net electric charge of a predetermined polarity in the body of the transistor. In order to refresh the data written to the memory cells 10, the refreshing circuit 22 causes the selection circuit 16 and writing circuit 18$i$ to apply pulse $I_1$ to all of the lines, and pulse $I_2$, as shown in FIG. 3, to all of the columns.

Pulse $I_1$ beginning at time $t_1$ and ending at time $t_2$ is applied to the gates of all of the transistors for a duration of some nanoseconds, and comprises a pulse of +0.6V applied to the gates, and +1.2V applied to the drains of the transistors. Pulse $I_2$, which begins at time $t_3$ and ends at time $t_4$, also having a duration of some nanoseconds, consists of the application of a pulse of −2V to the gates alone. The times $t_2$ and $t_3$ may be coincident.

Figure 4:
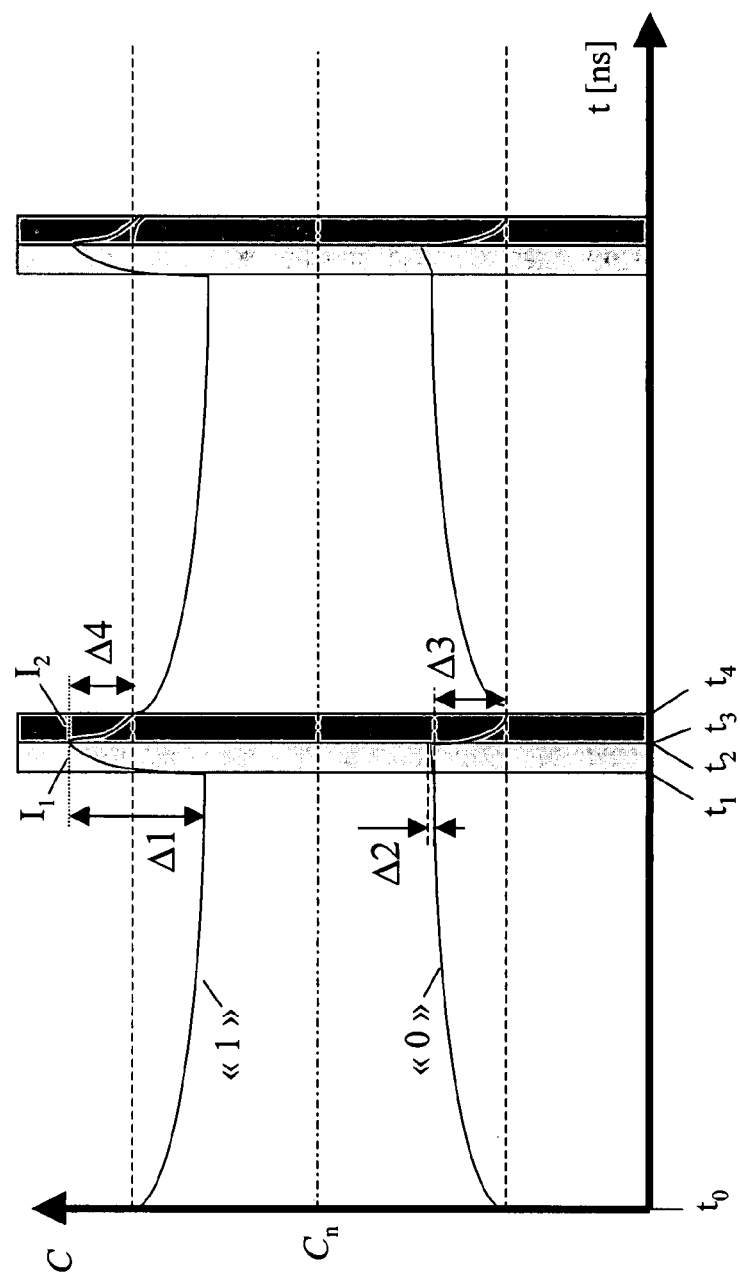
FIG. 4 shows the variation of charge with time in the body of each transistor of the device of FIG. 2 in each of the two charge states.

Referring now to FIG. 4, which shows in detail how the charge C stored in the transistor body of each memory cell 10 varies with time for each charge state (representing binary "0" and binary "1" states respectively), the line between the two curves indicates charge level $C_n$ towards which both charge levels tend if no refreshing operation is carried out. It will be appreciated that the two charge levels chosen to represent the respective data states must be sufficiently far apart as to remain distinguishable from each other throughout the range of allowed variation of charge of each level.

The cells 10 initially have a net positive charge represented by holes stored in the body of the transistor (representing state "1") or a much lower negative or substantially zero charge (representing state "0"), i.e. the two charged states being higher than or lower than charge level $C_n$ respectively. Without a refresh operation, the difference between these two charge levels decays generally logarithmically with time.

As disclosed in more detail in earlier European patent application no. 01810587.4, the electrical properties of the SOI MOSFET transistors of each data storage cell 10 vary according to the amount of charge stored in the body of the respective transistor. In particular, the threshold voltage of transistors in the higher charge state is lower than that of the transistors in the lower charge state.

When pulse $I_1$ is applied at time $t_1$, the voltage applied to the gates is arranged to be between the respective threshold voltages of the transistors in the higher and lower charge states. As a result, the transistor in the higher charge state is switched to its conductive state, i.e. a conductive channel between the source and drain forms in the body of the transistor in the vicinity of the gate, and a current can flow in the channel between the source and the drain at the interface of the body and the insulating layer adjacent the gate. This current flowing in the channel creates electron and hole pairs in the vicinity of the drain by impact ionisation, the holes being stored in the body, while the electrons are removed by the drain. In this way, the positive charge stored in the body of the transistors in the higher charge state increases by an amount $\Delta 1$, while the charge of the transistors in the lower charge state increases by a much smaller amount $\Delta 2$, since no conductive channel is formed in the transistors of lower charge state. $\Delta 1$ is generally 2 to 3 orders of magnitude greater than $\Delta 2$. It is found that electrons are trapped in structural defects in the body at its interface with the insulating film between the body and the gate generally to the same extent, regardless of whether the transistors are in the higher or lower charge state.

At time $t_3$, which is shown in FIG. 4 for the sake of clarity as being coincident with time $t_2$, the second pulse $I_2$ begins and causes the charge in the transistors of both charge states to be reduced. The pulse $I_2$ consists of a voltage of −2V applied to the gates, which attracts holes stored in the body of each transistor to the corresponding interface of the body and dielectric film, with the result that the holes recombine with electrons trapped in structural defects at the interface, reducing the net positive charge stored in the body. As can be seen from FIG. 4, in this way, the charge in the higher state is reduced back to its initial level, and the charge in the lower state is restored to its previous level. The charge in the transistor in the upper state is reduced by $\Delta 4$, and is reduced by $\Delta 3$ in the transistor in the lower state, $\Delta 4$ and $\Delta 3$ being approximately equal to each other.

It can therefore be seen that because pulse $I_1$ has a much more significant effect on transistors in the higher state than in the lower state, this pulse can be applied to all of the memory cells 10 simultaneously, with the effect that the "1" states are refreshed, without the transistors in the "0" state being converted to the "1" state and without the necessity of reading the charge state of each memory cell 10. This permits a refresh process to be made by whole memory blocks allowing, for example in the case of a 1 Gigabit memory, a refresh process approximately 1000 times faster than in the prior art. It is also possible to use transistors having technical characteristics less difficult to achieve than in the prior art, in particular, transistors having a lower charge retention time, for which the cost is consequently lower.

It will be appreciated by persons skilled in the art that the above embodiment has been described by way of example only, and not in any limitative sense, and that various alterations and modifications are possible without departure from the scope of the invention as defined by the appended claims. In particular, the order of application of pulses $I_1$ and $I_2$ can be reversed, and the above process described with reference to NMOS transistors can also be applied to PMOS transistors, the polarity of the voltages applied to the gates in that case being reversed. Also, JFET type transistors can be used as well as MOSFET type transistors. Furthermore, as well as being applicable to DRAM memory type devices, it will be appreciated by persons skilled in the art that the refreshing process can be applied to other types of data storage device, such as optical imaging devices and memory devices other than DRAM memories.

What is claimed is:

1. A memory cell array comprising:
   a plurality of memory cells, including a first memory cell and a second memory cell, wherein each memory cell of the plurality of memory cells includes an associated transistor having a source region, a drain region, an electrically floating body region disposed therebetween, and a gate disposed over the electrically floating body region, and wherein each memory cell further includes a charge in the body region of the associated transistor which varies with time and
   a first data state representative of a first charge provided in the body region of the associated transistor, and
   a second data state representative of a second charge in the body region of the associated transistor; and
   circuitry, coupled to the plurality of memory cells, to sequentially apply first and second electrical signals to first and second memory cells wherein:
   the first electrical signals are simultaneously applied to the first and second memory cells wherein, in response to the first electrical signals, (i) the first memory cell, which is in the first data state, is refreshed and (ii) the second memory cell, which is in the second data state, maintains the second data state; and
   the second electrical signals are simultaneously applied to the first and second memory cells wherein, in response to the second electrical signals, (i) the first memory cell, which is in the first data state, maintains the first data state and (ii) the second memory cell, which is in the second data state, is refreshed.

2. The memory cell array of claim 1 wherein, in response to the first electrical signals, the first memory cell is refreshed by increasing the number of majority carriers in the body region of the associated transistor.

3. The memory cell array of claim 1 wherein the conductivity of memory cells in the first state is higher than the conductivity of memory cells in the second state.

4. The memory cell array of claim 1 wherein, in response to the first electrical signals:
   the first memory cell includes a conductive channel in the body region of the associated transistor and between the source region and the drain region of the associated transistor; and
   the second memory cell does not include a conductive channel in the body region of the associated transistor and between the source region and the drain region of the associated transistor.

5. The memory cell array of claim 1 wherein, in response to the second electrical signals, the second memory cell is refreshed by reducing the number of majority carriers in the body region of the associated transistor.

6. The memory cell array of claim 1 wherein the circuitry includes a refreshing circuit, a selection circuit and a writing circuit.

7. The memory cell array of claim 1 wherein the second electrical signals include (1) a second gate signal applied: (i) to the gate of the transistor associated with the first memory cell and (ii) to the gate of the transistor associated with the second memory cell, and (2) a second drain signal applied: (i) to the drain region of the transistor associated with the first memory cell and (ii) to the drain region of the transistor associated with the second memory cell.

8. The memory cell array of claim 1 wherein the first electrical signals include (1) a first gate signal applied: (i) to the gate of the transistor associated with the first memory cell and (ii) to the gate of the transistor associated with the second memory cell, and (2) a first drain signal applied: (i) to the drain region of the transistor associated with the first memory cell and (ii) to the drain region of the transistor associated with the second memory cell.

9. A memory cell array comprising:
a plurality of memory cells, each memory cell including an associated transistor having a source region, a drain region, a body region disposed therebetween, and a gate disposed over the body region and separated therefrom by a dielectric, wherein each memory cell (i) further includes a charge which is representative of a data state wherein the charge varies with time and (ii) is reversibly programmed in a first data state and/or a second data state; and
circuitry, coupled to the plurality of memory cells, to sequentially apply first and second electrical signals to the plurality of memory cells, wherein:
the first electrical signals are simultaneously applied to the plurality of memory cells wherein, in response to the first electrical signals, (i) memory cells that are in the first data state are refreshed and (ii) memory cells that are in the second data state maintain the second data state; and
the second electrical signals are simultaneously applied to the plurality of memory cells wherein, in response to the second electrical signals, (i) memory cells that are in the second data state are refreshed and (ii) memory cells that are in the first data state maintain the first data state.

10. The memory cell array of claim 9 wherein the circuitry includes a refreshing circuit, a selection circuit and a writing circuit.

11. The memory cell array of claim 9 wherein, in response to the first electrical signals, each memory cell that is in the first data state is refreshed by increasing the charge in the body region of the associated transistor.

12. The memory cell array of claim 9 wherein, in response to the first electrical signals:
the transistor of each memory cell in the first data state includes a conductive channel, in the body region, between the source region and the drain region; and
the transistor of each memory cell in the second data state does not include a conductive channel, in the body region, between the source region and the drain region.

13. The memory cell array of claim 9 wherein the conductivity of memory cells in the first state is higher than the conductivity of memory cells in the second state.

14. The memory cell array of claim 9 wherein, in response to the second electrical signals, each memory cell that is in the second data state is refreshed by reducing the charge in the body region of the associated transistor.

15. The memory cell array of claim 9 wherein the first electrical signals include (1) a first gate signal applied to the gate of the associated transistor of each memory cell of the plurality of memory cells and (2) a first drain signal applied to the drain region of the associated transistor of each memory cell of the plurality of memory cells.

16. The memory cell array of claim 9 wherein the second electrical signals include (1) a second gate signal applied: (i) to the gate of the associated transistor of each memory cell of the plurality of memory cells and (ii) to the gate of the associated transistor of each memory cell of the plurality of memory cells, and (2) a second drain signal applied: (i) to the drain region of the associated transistor of each memory cell of the plurality of memory cells and (ii) to the drain region of the associated transistor of each memory cell of the plurality of memory cells.

17. A memory cell array comprising:
a plurality of memory cells arranged in a matrix form, each memory cell consisting essentially of an associated transistor comprising a source region, a drain region, a body region disposed therebetween, and a gate disposed over the body region and separated therefrom by a dielectric, wherein each memory cell is in (i) a first data state, or (ii) a second data state; and
circuitry, coupled to the plurality of memory cells, to apply first and second electrical signals to the plurality of memory cells, wherein:
the first electrical signals are simultaneously applied to the plurality of memory cells wherein, in response to the first electrical signals, (i) memory cells that are in the first data state are refreshed and (ii) memory cells that are in the second data state maintain the second data state; and
the second electrical signals are simultaneously applied to the plurality of memory cells wherein, in response to the second electrical signals, (i) memory cells that are in the second data state are refreshed and (ii) memory cells that are in the first data state maintain the first data state.

18. The memory cell array of claim 17 wherein the circuitry includes a refreshing circuit, a selection circuit and a writing circuit.

19. The memory cell array of claim 17 wherein, in response to the first electrical signals, each memory cell that is in the first data state is refreshed by increasing the number of majority carriers in the body region of the associated transistor.

20. The memory cell array of claim 17 wherein, in response to the first electrical signals:
the transistor of each memory cell in the first data state includes a conductive channel, in the body region, between the source region and the drain region; and
the transistor of each memory cell in the second data state does not include a conductive channel, in the body region, between the source region and the drain region.

* * * * *